United States Patent [19]

Watatani et al.

[11] 3,815,052

[45] June 4, 1974

[54] VOLTAGE CONTROLLED OSCILLATOR

[75] Inventors: Yoshizumi Watatani, Machida; Katsuo Mohri, Yokohama, both of Japan

[73] Assignee: Hitachi, Ltd., Tokyo, Japan

[22] Filed: Jan. 29, 1973

[21] Appl. No.: 327,688

[30] Foreign Application Priority Data

Jan. 28, 1972 Japan .................................. 47-9865

[52] U.S. Cl. .......... 331/117 R, 331/108 D, 331/135, 332/16 T

[51] Int. Cl. ............................................ H03b 5/12

[58] Field of Search ............ 331/117 R, 135, 108 C, 331/108 D

[56] References Cited

UNITED STATES PATENTS 3,686,587 8/1972 Dann .............................. 331/117 R 3,691,475 9/1972 Mouri et al. ........................ 331/135

*Primary Examiner*—John Kominski

*Attorney, Agent, or Firm*—Craig & Antonelli.

[57] ABSTRACT

A voltage controlled oscillator comprising an amplifier, a series resonance circuit, formed of a coil, a capacitor and a resistor, to which the output of said amplifier is supplied, a composite circuit for taking the vectorial sum and difference between a voltage across said resistor and a voltage across said coil or capacitor, a circuit for vectorially adding the sum signal and the difference signal at rates responsive to an external control voltage, and means to positively feedback the output of the adder circuit to the input side of said amplifier, the phase of said output of said adder circuit being changed in response to said external control voltage, to make the oscillation frequency of said oscillator variable.

12 Claims, 9 Drawing Figures

VOLTAGE CONTROLLED OSCILLATOR

BACKGROUND OF THE INVENTION

1. Field of the Invention

The present invention relates to a voltage controlled oscillator whose oscillation frequency can be varied by a control voltage. More particularly, it relates to a voltage controlled oscillator which is small in the number of employed components, such as coils and capacitors, and which can therefore be formed into an integrated circuit extremely easily.

2. Description of the Prior Art

A prior art voltage controlled oscillator is shown in FIG. 1. Referring to the figure, an output signal $\dot{a}$ of amplifier 1 is passed through two phase shifters 2 and 3, thereby to make a signal $\dot{b}$ leading in phase by $\theta_1$ and a signal $\dot{c}$ lagging in phase by $\theta_2$, respectively. The signals $\dot{b}$ and $\dot{c}$ are fed to an adder 4, and are composed into a signal $\dot{d}$. Further, the signal $\dot{d}$ is passed through a tank circuit 5, and is positively fed back to the amplifier 1. Thus, oscillation is effected at the natural or specific oscillation frequency of the tank circuit 5. If, at this time, a control voltage $V_c$ applied to the adder 4 is changed so as to control the phase of the signal $\dot{d}$, then the oscillation frequency will become variable.

As can be seen, the prior art voltage controlled oscillator requires capacitance elements or inductance elements at the three parts of the phase shifting circuits 2 and 3 and the tank circuit 5. The prior art is therefore disadvantageous in that, in the case of forming the oscillator into an integrated circuit, the number of components which are provided outside is large, thereby to make it impossible to sufficiently enjoy the effect of the integration. Moreover, the phase shifting circuits constituted of capacitance elements and inductive elements have a large dispersion, so that errors in the oscillation frequency become large.

SUMMARY OF THE INVENTION

It is accordingly an object of the present invention to provide a voltage controlled oscillator which is readily formed into an integrated circuit and which is subjected to only small errors in oscillation frequency, if any.

In order to accomplish the object of the invention, the oscillator of the present invention has its characterizing feature in being constructed such that a single resonance circuit is employed in place of the tank circuit and the phase shifting circuits, that a signal leading in phase by an angle $\theta$ and a signal lagging in phase by the same angle $\theta$ are derived from the output of the resonance circuit, and that a signal obtained by vectorially composing the two signals is positively fed back to the resonance circuit, to carry out oscillation. With such a construction, use of a single coil and a single capacitor suffices, and it is facilitated in the extreme to put the oscillator into an integrated circuit.

The other objects, features and advantages of the invention will be apparent from the following detailed description when read in conjunction with the accompanying drawings.

DESCRIPTION OF THE PREFERRED EMBODIMENTS

Figure 1:
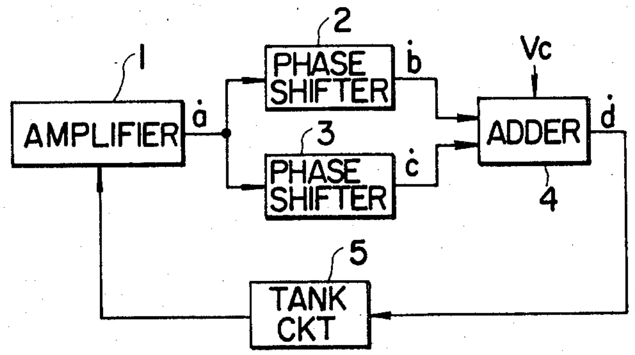
FIG. 1 is a block diagram showing the prior art voltage controlled oscillator which has already been explained.
Figure 2:
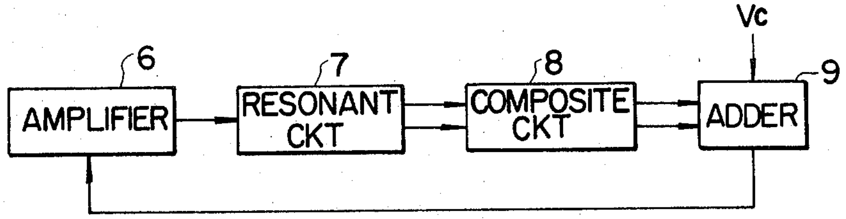
FIG. 2 is a block diagram showing the fundamental construction of the present invention.
Figure 3A:
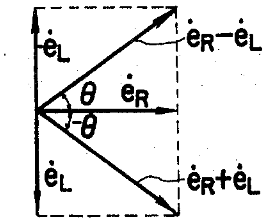
FIGS. 3(A) and 3(B) are vector diagrams for explaining the principle of phase control.
Figure 3B:
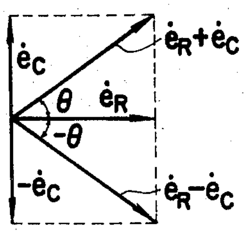
Figure 4A:
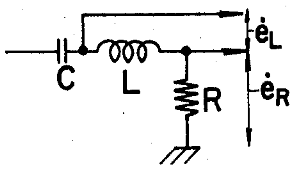
FIGS. 4(A), 4(B), 4(C), and 4(D) are circuit diagrams each showing a resonance circuit for use in the present invention.
Figure 4B:
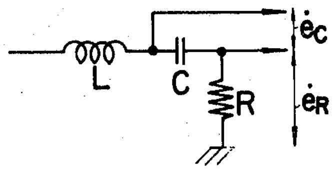
Figure 4C:
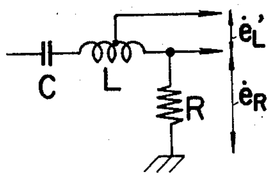
Figure 4D:
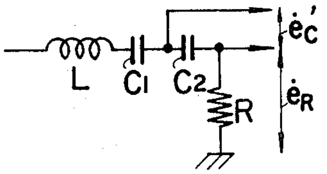

Referring to FIG. 2, an output signal from an amplifier 6 is fed to a resonance circuit 7. As shown in FIGS. 4(A) to 4(D), the resonance circuit 7 is composed of a resistor R, a coil L and a capacitor or capacitors C. From the resonance circuit 7, there are obtained a voltage $\dot{e}_R$ across the resistor R and an output $\dot{e}_L$ or $\dot{e}_C$ from one end of the coil L or one end of the capacitor C. In the case, the supply voltage of the oscillator should be made low in order to use the resonance circuit in an integrated circuit. In the case where the quality factor Q of the resonance circuit 7 is high, an output voltge $\dot{e}_L'$ is obtained from an intermediate part of the coil L by a tap as seen in FIG. 4(C) in order to prevent an excitation voltage, impressed on each transistor, from becoming excessively high. Alternatively, two capacitors $C_1$ and $C_2$ may be connected in series as in FIG. 4(D), so as to derive an output voltage $\dot{e}_C'$ from the juncture between them. The two signals which are thus obtained and which differ in phase by 90° from each other, are made inputs to a composite circuit 8.

In the composite circuit 8, addition and subtraction (addition after inverting the phase of one of the signals) between the two signals are performed, to obtain two signals of value $\dot{e}_R + \dot{e}_L$ or $\dot{e}_R + \dot{e}_C$, and $\dot{e}_R - \dot{e}_L$ or $\dot{e}_R - \dot{e}_C$. Herein, it can be similarly made to use $\dot{e}_L'$ from FIG. 4(C) instead of $\dot{e}_L$ and to employ $\dot{e}_C'$ from FIG. 4(D) instead of $\dot{e}_C$; however, only the case of employing $\dot{e}_L$ and $\dot{e}_C$ will be described hereunder. One of the two signals thus obtained leads in phase by $\theta$ with respect to the output voltage $\dot{e}_R$ derived from the resistor R, while the other signal lags in phase by $\theta$.

Subsequently, the two signals are fed to an adder 9, and are added therein in accordance with the following equation:

$$p\,(\dot{e}_R + \dot{e}_L) + q\,(\dot{e}_R - \dot{e}_L) = \dot{E}$$

where $\dot{E}$ denotes the output of the added 9, and $p$ and $q$ represent variable coefficients having the relation:

$$p + q = 1 \text{ (constant)}$$

The magnitudes of $p$ and $q$ can be varied by a control voltage $V_c$.

Subsequently, the output of the adder 9 is fed back to the amplifier 6. Herein, in the case where the output is in-phase with $\dot{e}_R$, positive feedback is established to conduct oscillation at the natural or specific oscillation frequency of the resonance circuit 7. In the case where there is a phase difference between the output of the adder 9 and $\dot{e}_R$, oscillation is carried out at a frequency which has a certain frequency difference from the natural oscillation frequency of the resonance circuit in conformity with the frequency characteristic and phase characteristic of the resonance circuit 7. With the oscillator thus constructed, the phase of the output signal $\dot{E}$ of the adder 9 can be changed within a certain range by the control voltage $V_c$, so that a voltage controlled oscillator can be realized.

The resonance circuit 7 can be replaced by a circuit having different frequency and phase characteristics. For example, a circuit determining the oscillation frequency, such as a primary filter and a general RC-oscillator, is employable. In the case of using the primary filter, the operation of the adder 9 should be made non-linear.

Figure 5:
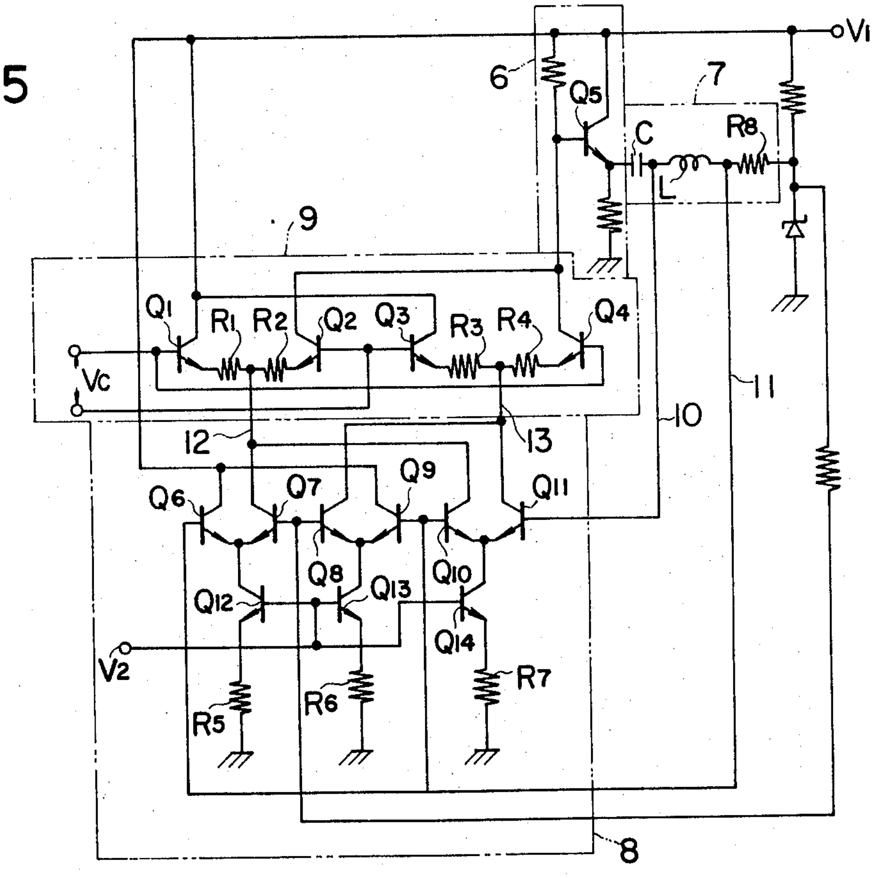
FIG. 5 is a circuit diagram showing an embodiment of the present invention.

FIG. 5 shows a circuit representing an embodiment of the present invention. An output of a transistor $Q_5$ is applied to a series resonance circuit consisting of a capacitor C and a coil L, to transmit an output 10 ($\dot{e}_L$) and an output 11 ($\dot{e}_R$). In this case, a fixed current flows through the collector of each of transistors $Q_{12}$ – $Q_{14}$ by virtue of a constant-current circuit which is constituted of the transistors $Q_{12}$ – $Q_{14}$, each having a fixed voltage $V_2$ applied to its base and resistors $R_5$ – $R_7$. A current $\dot{I}_R$ corresponding to $\dot{e}_R$ flows through the collector of each of transistors $Q_7$ and $Q_8$. A current $\dot{I}_L$ corresponding to $\dot{e}_L$ flows through the collector of a transistor $Q_{10}$, while a current $-\dot{I}_L$ flows through the collector of a transistor $Q_{11}$. As a result, a current 12 equal to $\dot{I}_R + \dot{I}_L$ and a current 13 equal to $\dot{I}_R - \dot{I}_L$ flows.

Two differential amplifiers each comprising transistors $Q_1$ and $Q_2$, or transistors $Q_3$ and $Q_4$, have their amplification factors controlled by a control voltage $V_c$ which is applied between the respective transistors. The collector voltage of the transistors $Q_2$ and $Q_4$, namely, the base voltage of the transistor $Q_5$ connected thereto, falls into a phase corresponding to the previously mentioned expression:

$$p\,(\dot{e}_R + \dot{e}_L) + q\,(\dot{e}_R - \dot{e}_L)$$

In this case, the control sensitivity for $V_c$ can be varied by changing the values of the resistors $R_1$ to $R_4$.

A positive feedback type oscillator is thus provided, which forms a voltage controlled oscillator capable of varying the frequency by the control voltage $V_c$. The voltage controlled oscillator according to the present invention does not employ the phase shifting circuits made up of elements such as coils, capacitors, resistors, etc., as in the prior art, but it has the corresponding section constituted of only one coil and one capacitor. It has such features of being very easily formed into an integrated circuit of having a small number of components to be externally mounted and of providing extremely small errors of frequency, and for these reasons it is greatly advantageous.

What is claimed is:

1. In a voltage controlled oscillator having an amplifier and a feedback circuit to positively feedback an output of said amplifier to an input thereof, said feedback circuit comprising:

1. an oscillation frequency determining means having a specific oscillation frequency and to which said output of said amplifier is supplied for providing two signals having a fixed phase difference therebetween,
2. composite circuit means for generating first and second signals representing a vectorial addition and a vectorial subtraction, respectively, between said two signals from said frequency determining means, and
3. an adder circuit which vectorially adds said first signal and said second signal provided from said composite circuit means at a rate responsive to a control voltage externally applied, and whose output is fed back to the input side of said amplifier, the phase of the output signal of said adder circuit being changed by said control voltage, thereby to make the oscillation frequency of said oscillator variable.

2. The voltage controlled oscillator according to claim 1 wherein said oscillation frequency determining means comprises a series circuit consisting of a capacitor, a coil and a resistor, one of said two signals having the fixed phase difference therebetween being derived from across said resistor and the other being derived from across said capacitor.

3. The voltage controlled oscillator according to claim 1 wherein said oscillation frequency determining means comprises a series circuit consisting of a capacitor, a coil and a resistor, one of said two signals having the fixed phase difference therebetween being derived from across said resistor and the other being derived from across said coil.

4. The voltage controlled oscillator according to claim 1 wherein said composite circuit means comprises:

1. three transistor circuits, each including first, second and third transistors and being constructed such that emitters of said first and second transistors are connected in common, that said third transistor is connected between the common emitters of the first and second transistors and ground and that a fixed potential is applied to a base of said third transistor,
2. means to apply one signal from said oscillation frequency determining means across respective bases of said first and second transistors in each of the first and second transistor circuits, and means to apply the other signal from said oscillation frequency determining means across respective bases of said first and second transistors in the third transistor circuit, and
3. means to connect in common the collector of one of said first and second transistors in said first transistor circuit and the collector of one of said first and second transistors in said third transistor circuit, thereby to obtain a first output from the common terminal, and means to connect in common the collector of one of said first and second transistors in said second transistor circuit and the collector of the other of said first and second transistors in said third transistor circuit, thereby to obtain a second output from the common terminal.

5. The voltage controlled oscillator according to claim 4 wherein said adder circuit comprises:

1. two transistor circuits, each being constructed such that emitters of fourth and fifth transistors are connected in common and that an external control voltage is applied across respective bases of said fourth and fifth transistors, and
2. means to connect in common a collector of one of said fourth and fifth transistors in the first transistor circuit and a collector of one of said fourth and fifth transistors in the second transistor circuit, thereby to obtain an output from the common terminal.

6. The voltage controlled oscillator according to claim 5 wherein said oscillation frequency determining means comprises a series circuit consisting of a capacitor, a coil and a resistor, one of said two signals having the fixed phase difference therebetween being derived from across said resistor and the other being derived from across said capacitor.

7. The voltage controlled oscillator according to claim 5 wherein said oscillation frequency determining means comprises a series circuit consisting of a capacitor, a coil and a resistor, one of said two signals having the fixed phase difference therebetween being derived from across said resistor and the other being derived from across said coil.

8. The voltage controlled oscillator according to claim 5 wherein said oscillation frequency determining means comprises a series circuit consisting of a capacitor, a coil and a resistor, one of said two signals having the fixed phase difference therebetween being derived from across said resistor and the other being derived from a center-tap of said coil.

9. The voltage controlled oscillator according to claim 5 wherein said oscillation frequency determining means comprises a series circuit consisting of a pair of capacitors, a coil and a resistor, one of said two signals having the fixed phase difference therebetween being derived from across said resistor and the other being derived from a point between said capacitors.

10. The voltage contrilled oscillator according to claim 1 wherein said adder circuit comprises:

1. two transistor circuits, each being constructed such that emitters of fourth and fifth transistors are connected in common and that an external control voltage is applied across respective bases of said fourth and fifth transistors, and
2. means to connect in common a collector of one of said fourth and fifth transistors in the first transistor circuit and a collector of one of said fourth and fifth transistors in the second transistor circuit, thereby to obtain an output from the common terminal.

11. The voltage controlled oscillator according to claim 1 wherein said oscillation frequency determining means comprises a series circuit consisting of a capacitor, a coil and a resistor, one of said two signals having the fixed phase difference therebetween being derived from across said resistor and the other being derived from a center-tap of said coil.

12. The voltage controlled oscillator according to claim 1 wherein said oscillation frequency determining means comprises a series circuit consisting of a pair of capacitors, a coil and a resistor, one of said two signals having the fixed phase difference therebetween being derived from across said resistor and the other being derived from a point between said capacitors.

* * * * *